United States Patent [19]

Ando et al.

[11] Patent Number: 4,918,350
[45] Date of Patent: Apr. 17, 1990

[54] ENERGY-TRAPPING-BY-FREQUENCY LOWERING-TYPE PIEZOELECTRIC RESONANCE DEVICE

[75] Inventors: Akira Ando; Toshihiko Kittaka; Yukio Sakabe, all of Nagaokakyo, Japan

[73] Assignee: Murata Manufacturing Co. Ltd., Japan

[21] Appl. No.: 211,777

[22] Filed: Jun. 27, 1988

[30] Foreign Application Priority Data

Jun. 26, 1987 [JP] Japan ............................. 62-160665
Sep. 19, 1987 [JP] Japan ............................. 62-235948

[51] Int. Cl.$^4$ ........................................... H01L 41/08
[52] U.S. Cl. .................................. 310/320; 310/358; 310/359; 310/366
[58] Field of Search ................ 310/320, 366, 358, 359

[56] References Cited

U.S. PATENT DOCUMENTS

| | | | |
|---|---|---|---|
| 3,590,287 | 6/1971 | Berlincourt et al. ................ | 310/358 |
| 3,961,210 | 6/1976 | Nagata et al. ........................ | 310/320 |
| 4,564,782 | 1/1986 | Ogawa ................................. | 310/359 |
| 4,605,876 | 8/1986 | Ogawa et al. .................. | 310/320 X |
| 4,652,784 | 3/1987 | Inoue et al. ......................... | 310/320 |

FOREIGN PATENT DOCUMENTS 57-147315  11/1982  Japan.
0123122    7/1985  Japan .................................. 310/320

Primary Examiner—Mark O. Budd
Attorney, Agent, or Firm—Ostrolenk, Faber, Gerb & Soffen

[57] ABSTRACT

A piezoelectric resonance device of the energy-trapped type utilizing a harmonic wave of the thickness extensional vibration mode, wherein three or more electrodes are so disposed that they are overlapped with each other through the piezoelectric layer in the direction of the thickness and each of the electrodes is comprised of a vibrating electrode portion for energy-trapping and a conducting portion for connecting the vibrating electrode to the side edge of the piezoelectric layer.

11 Claims, 7 Drawing Sheets

COMPOSITION NEAR M.P.B
$0.1Pb(Mn_{\frac{1}{3}}Nb_{\frac{2}{3}})O_3 + 0.4PbTiO_3 + 0.5PbZrO_3$ TETRAGONAL SYSTEM:
$0.1Pb(Mn_{\frac{1}{3}}Nb_{\frac{2}{3}})O_3 + 0.6PbTiO_3 + 0.3PbZrO_3$ RHOMBOHEDRAL SYSTEM:
$0.1Pb(Mn_{\frac{1}{3}}Nb_{\frac{2}{3}})O_3 + 0.3PbTiO_3 + 0.6PbZrO_3$

ENERGY-TRAPPING-BY-FREQUENCY LOWERING-TYPE PIEZOELECTRIC RESONANCE DEVICE

CROSS-REFERENCE TO RELATED APPLICATIONS

This application is related to Ser. No. 215,549 filed July 6, 1988; and Ser. No. 211,777 filed June 27, 1988, both commonly assigned herewith.

FIELDS OF THE INVENTION

The present invention relates to an improvement in a piezoelectric resonance device of a frequency-lowering-type energy-trapped type utilizing the thickness extensional vibration mode.

DESCRIPTION OF PRIOR ART

A piezoelectric vibrator of an energy-trapped type utilizing the thickness extensional vibration mode made of PZT system piezoelectric ceramic has been is known heretofore. The piezoelectric vibrator of such an energy-trapped type is structured by forming electrodes on opposite faces of a piezoelectric ceramic plate, with the area of the electrodes being smaller than that of the face of the ceramic plate.

As the piezoelectric ceramic material, only a material with an effective Poisson's ratio being $\frac{1}{3}$ or more has been used, such as the composition near the morphotropic phase boundary (M.P.B.) of PZT system. The reason for this is that a use of the material with the Poisson's ratio of lower than $\frac{1}{3}$ does not enable the energy of the thickness extensional vibration mode to be trapped that the resonance frequency.

There is a demand, for a piezoelectric vibrator of the above type and usable in a higher frequency region. For enabling the vibration in the higher region, it is required to reduce the thickness of the piezoelectric plate. However, the thickness limit of the plate is approximately 200 $\mu$m in view of handling, and it is difficult to shape the piezoelectric plate thinner than 200 $\mu$m. Hence, the usable frequency range of the thickness extensional vibration has been limited practically to 10 MHz.

On the other hand, it might be thought that the utilization of the third harmonic of the thickness extensional vibration mode would allow the piezoelectric vibrator to be used in the higher frequency region. The response level of the third harmonic, however, is considerably lower than that of the fundamental wave, limiting the application of the third harmonic to specific fields.

Further, with the conventional piezoelectric element, the scope of selection of materials was limited to the composition near the M.P.B. of the PZT system piezoelectric material, since the vibratory energy cannot be trapped, with the resonance frequency being lowered, unless the effective Poisson's ratio is more than $\frac{1}{3}$. Also, the scope of selection of the properties such as the electromechanical coupling factor, mechanical quality factor, temperature dependency of the resonance frequency, limiting temperature for heat-resistance, and the like was limited to a very narrow range.

A lead-titanate system material is known to be a material with a Poisson's ratio of less than $\frac{1}{3}$. The piezoelectric material of the lead titanate system has low dielectric constant $\epsilon_{33}/\epsilon_0$ shows the relatively large piezoelectricity, thus causing the high mechanical quality factor $Q_m$. Further, it has a superior advantage of having a high Curie point, so that a piezoelectric characteristic stability can be obtained at even high temperature.

However, with the above piezoelectric material of the lead-titanate system, the energy of the fundamental wave of the thickness extensional vibration cannot be trapped as described above. Thus, irrespective of its good properties, the material cannot be practically applied to an electronic device such as a filter or vibrator.

Superior heat resistance is required in the piezoelectric vibrator as one element of reliability, but the limiting temperature at which the piezoelectricity begins to degrade is relatively low, say, approximately 220° C. in case of the composition near the M.P.B. of the PZT system. In also the electric properties, there are problems that the use of the composition near the M.P.B. of the PZT system causes the $Q_m$ of the thickness vibration to be merely about 500, which results in that the stability of vibration is not sufficient to apply to the vibrator or the like and that an impedance difference, i.e., the ratio of antiresonance resistance to the resonance resistance, becomes lowered as the frequency is higher.

SUMMARY OF THE INVENTION

Accordingly, the object of the present invention is to provide a piezoelectric resonance device comprising a structure usable in a higher frequency region and enabling wide selection of piezoelectricity, wherein the vibratory energy can be suitably trapped.

The present inventors have conducted intensive investigations and, as a result, they have found that a piezoelectric resonance device of the energy-trapped type usable in a higher frequency region can be obtained by forming a piezoelectric resonance device of the multi-layered monolithic type comprising the structure described below.

According to a broad aspect of the present invention, there is provided a piezoelectric resonance device of the energy-trapped type utilizing the thickness extensional vibration mode and comprising a plate-like body made of the piezoelectric material and three or more electrodes disposed so as to be overlapped with each other through an intervening piezoelectric layer in the direction of the thickness of the body, each of these electrodes being comprised of a vibrating electrode portion for trapping the vibratory energy and a conductive portion for connecting the vibrating electrode portion and the side edge of the body of the piezoelectric material.

With the monolithic piezoelectric resonance device of the present invention, since at least three electrodes are so disposed that they are overlapped with each other through the intervening piezoelectric layer in the direction of the thickness, the primary response of the thickness extensional vibration appears at an $(n-1)$ times higher frequency point (wherein n denotes the number of electrodes) compared with that of the conventional piezoelectric resonator of the single plate type assuming the total thickness of the devices are the same.

Further, as the plate-like body is divided into a plurality of piezoelectric layers by at least three electrodes, the energy of the thickness extensional vibration can be trapped by utilizing the effect of the resonance frequency being lowered between the electrodes, even if using piezoelectric material with the Poisson's ratio of less than $\frac{1}{3}$, which has not been able to be used heretofore to form a resonator of the energy-trapped type.

BRIEF DESCRIPTION OF THE INVENTION

Preferably, each of the conductive portions for connection is so formed that it is not overlapped in the direction of the thickness with the adjacent conductive portion spaced with one layer of the piezoelectric material, whereby the formation of the capacitance between the neighboring conductive portions for connection can be prevented to suppress generation of unnecessary spurious modes.

According to a more specific aspect of the present invention, there is provided a piezoelectric resonance device, in which the piezoelectric layers interposed between the electrodes are polarized in the direction of the thickness so that the polarization directions of the adjacent layers are opposite to each other, and the conductive portions for connection are formed not to be overlapped to each other in the direction of the thickness.

According to a further aspect of the present invention, there is provided a piezoelectric resonance device, in which the piezoelectric layers interposed between the electrodes are polarized in the same direction in the the direction of thickness and at least the conducting portions for connection are applied with potentials of opposite polarities in operation and are so formed that they are not overlapped with each other in the direction of the thickness.

With the present invention, the electrode or electrodes disposed inside the device are formed so as to be disposed directly between the electrodes formed on the outer surfaces of the body for energy-trapped when viewed from the direction of the thickness, thereby enabling the generation of the spurious mode overlaying the fundamental wave described above to be effectively reduced.

Particularly, the present inventors found that the relatively large spurious mode overlaying the fundamental vibration is due to the capacitance produced in the portion other than the region where the energy is trapped, and, hence, the present inventive device is do structured that the production of such capacitance is prevented.

Accordingly, with the present invention, there is little or no generation of the capacitance in region other than that where the energy is trapped, so that the spurious mode can be suppressed as described above.

As the piezoelectric material used in the present invention, there may be used lead titanate-zirconate system material (i.e., the PZT system), or lead titanate system material.

As described heretofore, the energy of the thickness extensional vibration can be trapped in such a direction as to lower the resonance frequency, even if a material with an effective Poisson's ratio being less than $\frac{1}{3}$ is used. Therefore, in using the above PZT system, there may be used a composition having the tetragonal or rhombocubic crystal structure and not being a composition on the M.P.B., which allows a resonator having a large electromechanical coupling factor to be obtained. Also, the use of a material of the PZT system enables the resonator having a small temperature coefficient of the resonance and antiresonance frequency to be easily obtained.

Further, the use of the piezoelectric material of the lead titanate system with the Poisson's ratio of less than $\frac{1}{3}$ also enables an excellent resonator having high reliability and a large impedance difference to be obtained.

Accordingly, since all the compositions falling in the PZT system can be used, and the material to be used can also be selected from the piezoelectric material of the lead titanate system, which has not been used heretofore, a piezoelectric resonance device having different properties can be obtained by utilizing a wide range of the piezoelectricity.

Therefore, there can be easily obtained a vibrator, piezoelectric filter or the like suitable for different applications.

These and other objects and features of this invention will become more apparent from the following detailed description to be given with reference to the drawings.

DESCRIPTION OF THE PREFERRED EMBODIMENTS

Figure 1:
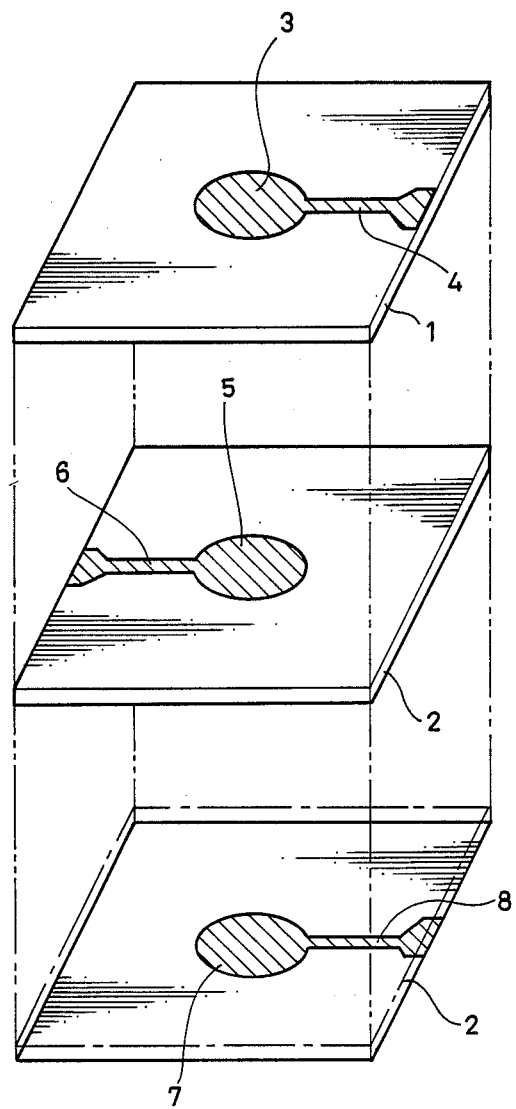
FIG. 1 is a perspective view for illustrating ceramic green sheets and electrode patterns formed thereon.

FIG. 1 is a perspective view for illustrating ceramic green sheets and electrode patterns formed thereon used for obtaining one embodiment of the present invention. Initially, referring to FIG. 1, a process for obtaining the embodiment will be described.

There are provided two ceramic green sheets 1 and 2 made of the PZT system piezoelectric material. A paste 3 for forming an electrode is coated in a circular region for trapping energy on the upper surface of the ceramic green sheet 1. The paste 3 is coated not only on the vibrating electrode portion for energy-trapping, but also on a portion 4 extending to one edge of the ceramic green sheet 1. The portion 4 extending to the edge of the ceramic green sheet 1 constitutes a conductive portion for connection as described hereinafter.

Also, a paste 5 for forming electrode is coated on the upper surface of the ceramic green sheet 2 so as to form a vibrating electrode portion. As is on the upper surface of the ceramic green sheet 1, the paste 5 is coated to a portion extending to one edge of the ceramic green sheet 2.

Further, as illustrated by seeing through the ceramic green sheet 2, an electrode paste 7 is coated on the lower surface of the ceramic green sheet 2. The electrode paste 7 is coated for forming the other vibrating electrode for trapping energy. The electrode paste 7 is also coated so as to extend the other edge of the ceramic green sheet 2. A portion 8 extending to the other edge serves as a conductive portion for connection.

The ceramic green sheets 1 and 2 are stacked and compressed in the direction of the thickness. After pressing, the formed body obtained by pressing is sintered to obtain a piezoelectric resonance device 10 having a plate-like shape shown in FIG. 2. Piezoelectric layers 11 and 12 in the plate-like body 10a, which are matured from ceramic green sheets 1, 2, are polarized in the direction of arrows shown in FIG. 2. The polarization can be carried out by applying an electric potential between the vibrating electrodes 13 and 17.

In operation, an electric potential of (+) or (−) may be applied to the electrodes 13 and 17, while an electric potential of (−) or (+) to the electrode 15.

With the piezoelectric resonance device described above, the vibrating electrodes 13, 15 and 17 corresponds to the portions 3, 5 and 7 coated by the electrode paste shown in FIG. 1. Thus, these electrodes 13, 15 and 17 are disposed so that they are overlapped in the direction of the thickness in the plate-like body 10a comprised of the piezoelectric material. Therefore, the piezoelectric resonance device can be used for higher frequency applications, as compared with the conventional piezoelectric resonance device of monoplate type having the same thickness as the embodiment. The reason for this is that the thickness extensional vibration mode, whose wavelength equals twice as the distance between the vibrating electrodes 13 and 15 or the electrodes 15 and 17.

Further, as seen from FIG. 1, the electrode paste extending portions 4 and 8 are so formed that each of them is not overlapped with the electrode paste extending portion 6 in the direction of the thickness. Therefore, any capacitance formed between the electrodes adjacent to each other in the direction of thickness is not formed outside the region encircled in two dashed line A shown in FIG. 2, namely, the region where the vibration energy is trapped.

Accordingly, since little or no capacitance is formed outside the region where the energy is trapped, the level of the spurious mode described above can be effectively suppressed. The mechanism of this will be described below more specifically by comparing the embodiment with a comparative example shown in FIGS. 3 and 4.

Figure 3:
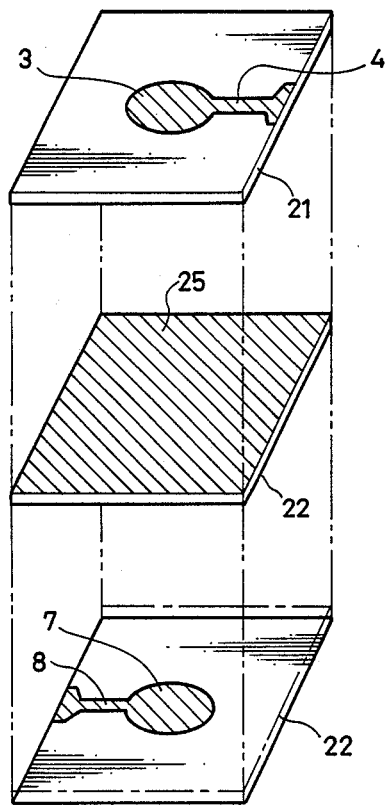
FIG. 3 is a perspective view showing ceramic green sheets and electrode patterns formed thereon used for obtaining the comparative example.
Figure 4:
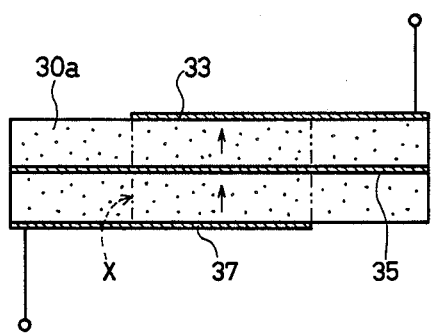
FIG. 4 is a sectional view showing the comparative example obtained by use of the structure in FIG. 3.

Referring to FIG. 3, ceramic green sheets 21 and 22 are provided to obtain the comparative example. An electrode paste portion 3 and electrode paste extending portion 4 are formed on the upper surface of the ceramic green sheet 21 by coating electrode paste, in the same way as those on the ceramic green sheet 1 in FIG. 1. Also, an electrode paste portion 7 and electrode paste extending portion 8 are formed on the lower surface of the ceramic green sheet 22, in the same way as those on the lower surface of the ceramic green sheet 1 in FIG. 1. However, the entire of the upper surface of the ceramic green sheet 22 is coated by an electrode paste 25. Therefore, when a compact, which is obtained by stacking the ceramic green sheets 21 and 22 in the form as shown in FIG. 3 to compress them in the direction of the thickness, is co-fired, a piezoelectric resonance device shown in FIG. 4 is obtained.

The thickness extensional fundamental vibration is trapped in the higher frequency region as compared to the prior art piezoelectric resonance device of the single plate-type, since the electrodes 33, 35 and 37 are disposed so as to be overlapped with each other in the direction of the thickness in the sintered body 30a made of the piezoelectric material.

Figure 5:
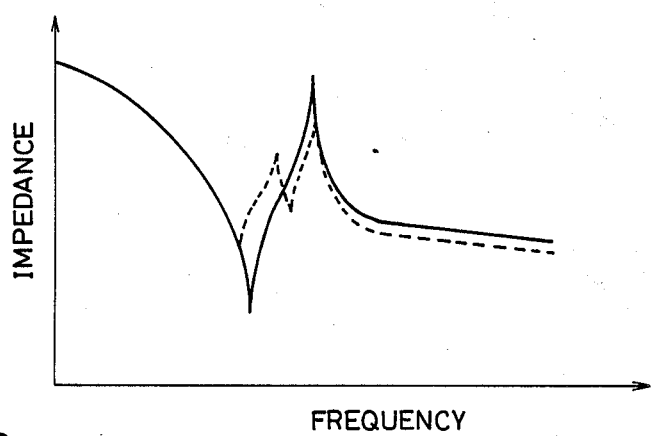
FIG. 5 is a diagram showing the impedance-frequency characteristics of the embodiment in FIG. 1 and the comparative example.

The electrode 35, however, is formed in the form of the entire surface electrode and thus capacitance is formed outside the portion (the region encircled by a broken line X) where the energy is trapped. More specifically, the capacitance becomes to be formed between the electrode 35 and the connecting conductive portions connected to the electrodes 33 and 37, respectively. Hence, as seen from the broken line in FIG. 5, a large spurious mode occurs on the fundamental wave of the thickness extensional vibration. As compared to this, such a large spurious mode does not occurs very little with the embodiment of FIG. 2 as seen from the bold line in FIG. 5.

Figure 2:
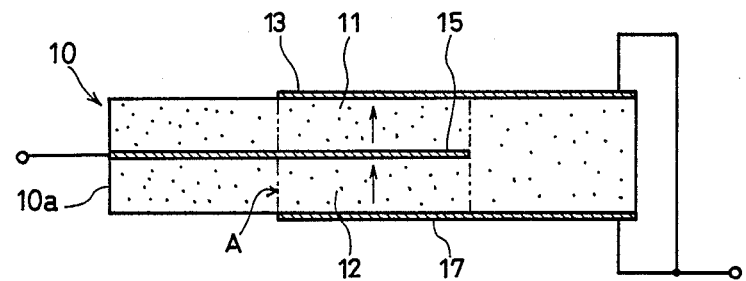
FIG. 2 is a sectional view showing the embodiment obtained by using the structure shown in FIG. 1.
Figure 6:
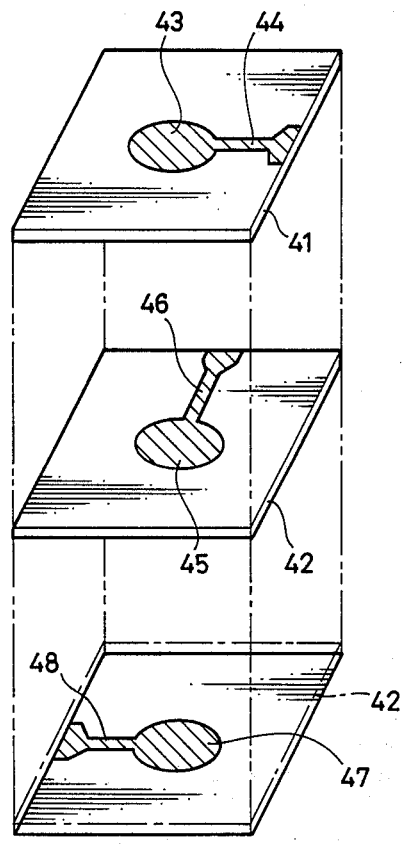
FIG. 6 is a perspective view for illustrating the ceramic green sheets used for obtaining the second embodiment of the present invention and the electrode patterns formed thereon.

FIG. 6 is a perspective view for illustrating ceramic green sheets and electrode patterns formed thereon to obtain the embodiment shown in FIG. 2. There are provided ceramic green sheets 41 and 42. Electrode paste portions 43, 45 and 47 are formed by coating paste in the same way as that of the embodiment shown in FIG. 2. The difference from the embodiment shown in FIG. 2 resides in the point that an extending portion 46 linked with the electrode paste 45 formed on the upper surface of the ceramic green sheet 41 is led out to another edge of the green sheet in the direction perpendicular to the electrode paste extending portions 44 and 48 apart from the electrode paste 45 through the ceramic green sheets 41, 42 and formed outer side in the direction of thickness. In other words, in the electrode patterns in FIG. 6, all of the electrode paste extending portions 44, 46 and 48 corresponding to the connecting conductive portions are led-out in the directions different from each other, enabling the reduction in capacitance between the connecting conductive portions.

Figure 7:
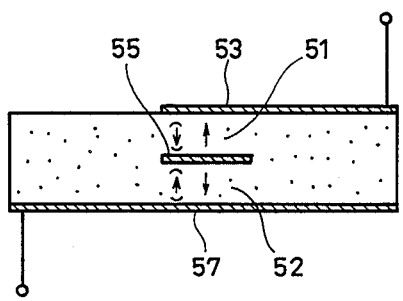
FIG. 7 is a sectional view showing the second embodiment obtained by the use of the structure shown in FIG. 6.

Then, with the embodiment obtained, the piezoelectric layers 51 and 52 are treated to be polarized in the opposite directions as arrowed shown in FIG. 7 in the direction of their thickness, respectively. In polarizing them, the electric potential of (+) or (−) is applied to the electrode 55, while the electric potential of (−) or (+) to the electrodes 53 and 57. In operation of the device, the electrode 55 is not utilized and the electric potential of (+) and (−) may be applied to the electrodes 55 and 57, respectively.

In addition, the electrodes 13 and 17 shown in FIG. 2 or the electrodes 53 and 57 in FIG. 7 may be formed by thin film forming methods such as burning of electrode paste, deposition, sputtering or the like after sintering the compact.

Although three electrodes are disposed to be overlapped with each other in the direction of the thickness, four or more electrodes may be disposed to be overlapped in such a relation.

Description will be developed below with respect to specific examples obtained by selecting different PZT system and lead titanate system materials.

Examples Using Piezoelectric Material of PZT System

Figure 8A:
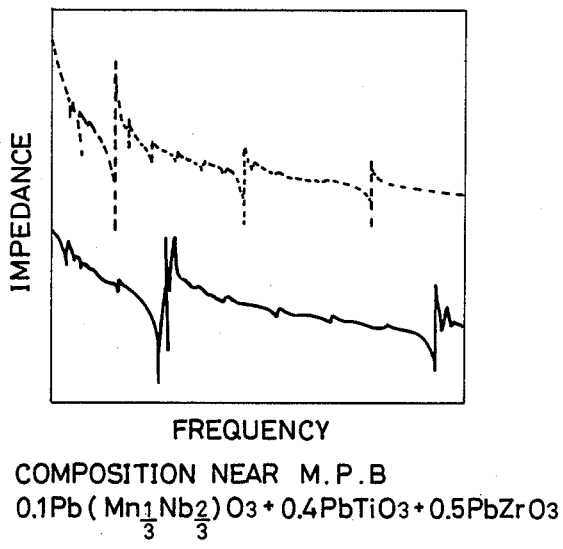
FIGS. 8A to 8C are diagrams showing the impedance-frequency characteristic of the resonators according to the specific examples using the PZT system materials, respectively.
Figure 8B:
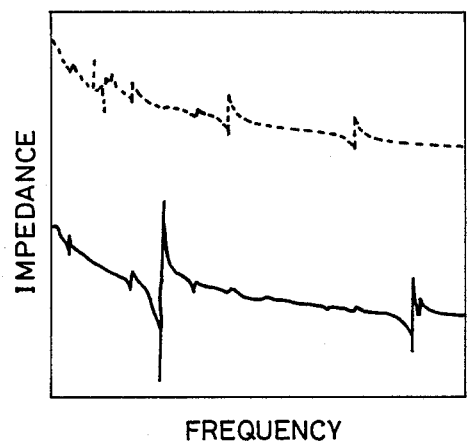
Figure 8C:
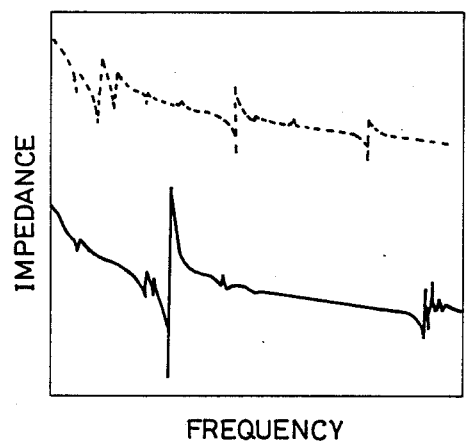

The piezoelectric resonance devices having the structure of the embodiment shown in FIG. 2 were formed by using piezoelectric materials having compositions shown in the lower portion in FIGS. 8A, 8B and 8C, respectively, and the impedance-frequency characteristics of them were measured. As a result, it was proved that these devices reveal the impedance-frequency characteristics shown in bold lines in FIGS. 8A to 8C. In addition, the characteristics in the broken line in FIGS. 8A to 8C are those of piezoelectric resonance devices of the single plate type obtained by the use of the same material.

As seen from FIGS. 8A to 8C, in case of the composition not being near M.P.B. of PZT system piezoelectric material (the composition shown in FIG. 8A), it will be understood that the energy of the thickness fundamental vibration cannot be trapped with the conventional structure of the single plate type. Contrary to this, it will be understood that according to the structure of the embodiment, the secondary harmonic wave can be suitably trapped even if the composition is outside M.P.B. of the PZT system material.

In case of the composition near M.P.B. (in case of the composition in FIG. 8A), the impedance responses due to other vibration modes overlap to the portion showing the impedance response due to the secondary harmonic wave with the structure of the embodiment. However, it is noted that vibrations showing those responses are also suitably energy-trapped.

The energy-trapping characteristics of the secondary harmonic wave of the PZT piezoelectric material will be shown in Tables 1 to 3.

Table 1 indicates a change in the characteristic with a variation in Ti/Zr ratio in two component system of $PbTiO_3$—$PbZrO_3$.

On the other hand, Table 2 shows the characteristic of the resonance device obtained by the use of the composition comprised of PZT piezoelectric materials added with different kinds of third components and such composition has been considered to be that the same does not enable the energy-trapping of the frequency-lowering type of the fundamental wave of the thickness vibration.

Figure 9:
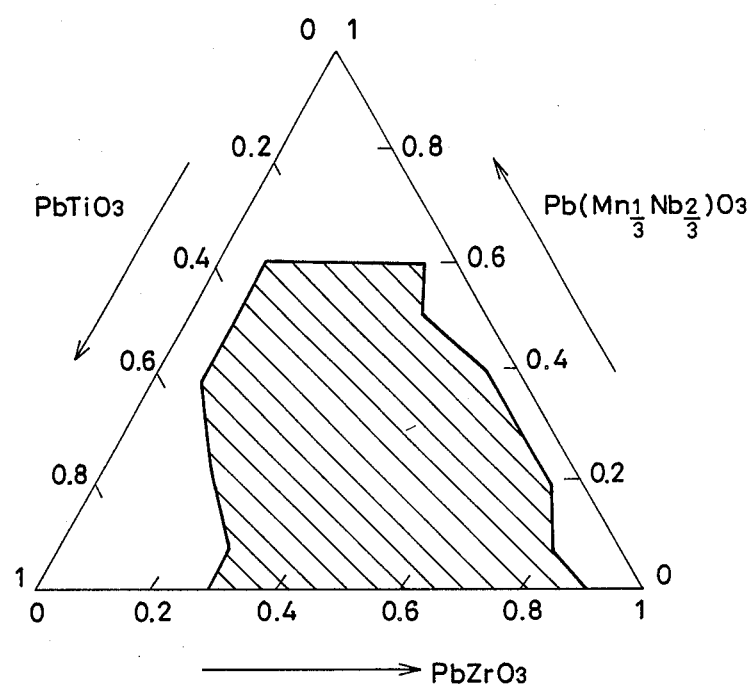
FIGS. 9 and 10 are diagrams indicating the range of the composition, in case of being added with $Pb(Mn_{\frac{1}{3}}Mn_{\frac{2}{3}})O_3$ and $Pb(Co_{\frac{1}{3}}Mn_{\frac{2}{3}})O_3$, respectively.
Figure 10:
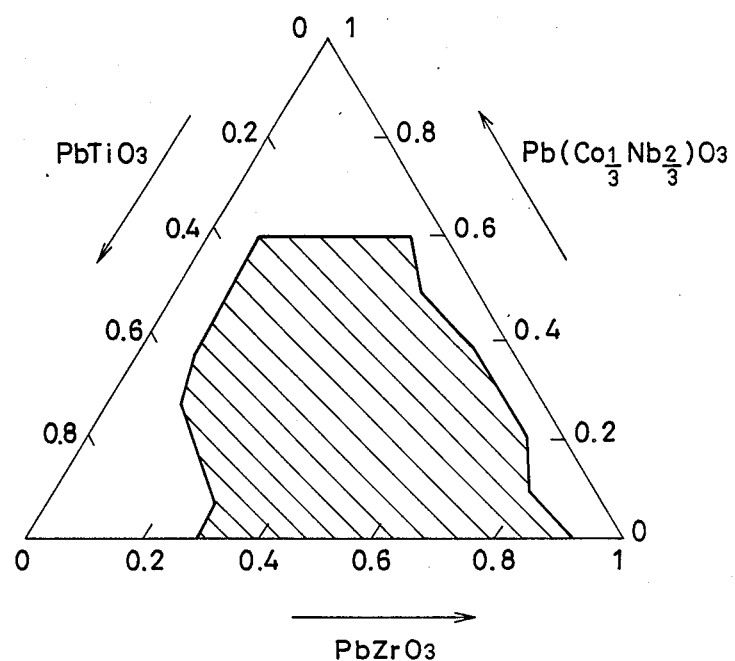

Table 3 shows the characteristics in the case of using the piezoelectric material having the composition in the range shown in FIGS. 9 and 10, where $Pb(Mn_{\frac{1}{3}}Nb_{\frac{2}{3}})O_3$ and $Pb(Co_{\frac{1}{3}}Nb_{\frac{2}{3}})O_3$ are added as the third components.

It will be noted that the impedance difference is caluculated by the equation, $20 \times \log 10$ (impedance at anti resonance frequency/impedance at resonance frequency).

As seen from Table 3, it can be understood that the impedance difference is 60 dB or more, resulting in the good energy-trapping characteristic.

In addition, as the PZT system piezoelectric material there may be used different materials shown in Table 4 described below besides those used in the above experiments.

The term "PZT system piezoelectric material" used herein is intended to comprise a two component system of $PbTiO_3$—$PbZrO_3$; a three component system of $PbTiO_3$—$PbZrO_3$-composite oxide (say, $A^{2+}B^{4+}O_3$, $A^{1+}B^{5+}O_3$, $A^{1+}B^{5+}O_3$, $A_2B_2O_7$, $Bi_2A_{x-1}B_xO_{3x+3}$, $A_xB_2O_6$ or the like; See Table 4); such three component system further added with other composite oxide or oxides (i.e.; $A'^{2}+B'^{4}+O_3$, $A'^{1}+B'^{5}+O_3$, $A'_2B'_2O_7$, $Bi_2A'_{x-1}B'_xO_{3x+3}$, $A'_xB_2O_6$ or the like); any of these 65 system with a part of Pb contained therein being substituted with Ba, Ca, or Sr; any of these systems with a part of Ti or Zr being substituted with Sn, Hf or the like; or any of these systems, which composition being off stoichiometric composition within the range of +50%. The feature of all the materials described above is that they are ferroelectrics.

Further, there is nothing to say that as the composite oxide there may be selected the oxide such as $Pb(Sn_{\frac{1}{2}}Sb_{\frac{1}{2}})O_3$ in which the number of the transition metal is not integral one,

TABLE 1 energy trapping characteristic of secondary harmonic wave of resonance apparatus made of $\chi PbZrO_3 + (1 - \chi)PbTiO_3$;

| χ (mol %) | $k_t$ [%] | impedance difference [dB] | crystal system |
|---|---|---|---|
| 0.00 | — | — | — |
| 0.10 | — | — | — |
| 0.20 | — | — | — |
| 0.30 | 10.2 | 68 | T |
| 0.35 | 11.8 | 68 | T |
| 0.40 | 12.7 | 70 | T |
| 0.42 | 14.0 | 71 | T |
| 0.44 | 15.3 | 71 | T |
| 0.46 | 16.1 | 74 | T |
| 0.48 | 24.4 | 76 | T |
| 0.50 | 31.6 | 78 | T |
| 0.52 | 47.2 | 65 | M.P.B. |
| 0.54 | 42.8 | 68 | R |
| 0.56 | 41.5 | 67 | R |
| 0.58 | 40.2 | 68 | R |
| 0.60 | 38.3 | 70 | R |
| 0.65 | 36.0 | 72 | R |
| 0.70 | 36.1 | 72 | R |
| 0.75 | 35.0 | 75 | R |
| 0.80 | 37.0 | 75 | R |
| 0.85 | 38.6 | 74 | R |
| 0.90 | 42.0 | 69 | R |

$k_t$: electromechanical coupling factor,
T: tetragonal system,
R: rhombohedral system,
M.P.B.: morphotropic phase boundary

TABLE 2 energy-trapping characteristic of secondary harmonic wave in case of using different PZT system piezoelectric materials ($0.1A + 0.52PbTiO_3 + 0.38PbZrO_3$)

| A | $k_t$ [%] | impedance difference [dB] | crystal system |
|---|---|---|---|
| $Pb(Mg_{\frac{1}{3}}Nb_{\frac{2}{3}})O_3$ | 39.0 | 76 | T |
| $Pb(Zn_{\frac{1}{3}}Nb_{\frac{2}{3}})O_3$ | 38.0 | 73 | T |
| $Pb(Mn_{\frac{1}{3}}Nb_{\frac{2}{3}})O_3$ | 38.0 | 80 | T |
| $Pb(Co_{\frac{1}{3}}Nb_{\frac{2}{3}})O_3$ | 46.2 | 71 | T |
| $Pb(Ni_{\frac{1}{3}}Nb_{\frac{2}{3}})O_3$ | 50.3 | 68 | T |
| $Pb(Mg_{\frac{1}{3}}Ta_{\frac{2}{3}})O_3$ | 40.5 | 72 | T |
| $Pb(Mn_{\frac{1}{3}}Ta_{\frac{2}{3}})O_3$ | 37.4 | 75 | T |
| $Pb((Mn_{\frac{1}{3}}Sb_{\frac{2}{3}})O_3$ | 36.9 | 77 | T |
| $Pb(Ni_{\frac{1}{3}}Sb_{\frac{2}{3}})O_3$ | 47.7 | 69 | T |
| $Pb(Fe_{\frac{1}{2}}Nb_{\frac{1}{2}})O_3$ | 40.1 | 70 | T |
| $Pb(Mn_{\frac{1}{2}}Nb_{\frac{1}{2}})O_3$ | 36.6 | 78 | T |
| $Pb(Co_{\frac{1}{2}}W_{\frac{1}{2}})O_3$ | 35.5 | 71 | M.P.B. |
| $Pb(Ni_{\frac{1}{2}}W_{\frac{1}{2}})O_3$ | 43.8 | 70 | T |
| $Pb(Fe_{\frac{2}{3}}W_{\frac{1}{3}})O_3$ | 44.7 | 69 | T |

$k_t$: electromechanical coupling factor,
T: tetragonal

TABLE 3 characteristic in case of using
$\chi A + Y PbZrO_3 + (1 - \chi - Y)PbTiO_3$

| A | χ mol % | Y mol % | $k_t$ [%] | impedance difference [dB] | crystal system |
|---|---|---|---|---|---|
| $Pb(Mn_{\frac{1}{3}}Nb_{\frac{2}{3}})O_3$ | 10 | 30 | 12.3 | 71 | T |
| " | 10 | 40 | 31.7 | 80 | T |
| " | 10 | 50 | 52.1 | 69 | M.P.B. |
| " | 10 | 60 | 45.5 | 78 | R |
| " | 10 | 70 | 43.9 | 75 | R |
| " | 10 | 80 | 47.2 | 74 | R |
| " | 20 | 20 | 50.7 | 68 | T |

TABLE 3-continued characteristic in case of using
$\chi A + Y PbZrO_3 + (1 - \chi - Y)PbTiO_3$

| A | χ mol % | Y mol % | $k_t$ [%] | impedance difference [dB] | crystal system |
|---|---|---|---|---|---|
| " | 20 | 30 | 27.4 | 73 | T |
| " | 20 | 40 | 53.1 | 71 | M.P.B. |
| " | 20 | 50 | 47.8 | 75 | R |
| " | 20 | 60 | 45.8 | 77 | R |
| " | 20 | 70 | 43.2 | 72 | R |
| " | 20 | 75 | 51.9 | 69 | R |
| " | 30 | 15 | 11.6 | 68 | T |
| " | 30 | 20 | 18.3 | 74 | T |
| " | 30 | 30 | 35.0 | 78 | T |
| " | 30 | 40 | 37.7 | 73 | M.P.B. |
| " | 30 | 50 | 35.4 | 76 | R |
| " | 30 | 60 | 34.1 | 71 | R |
| " | 30 | 65 | 35.8 | 69 | R |
| " | 40 | 10 | 17.4 | 65 | T |
| " | 40 | 20 | 27.6 | 78 | T |
| " | 40 | 30 | 31.5 | 79 | M.P.B. |
| " | 40 | 40 | 28.6 | 77 | R |
| " | 40 | 50 | 27.3 | 70 | R |
| " | 40 | 55 | 29.0 | 65 | R |
| " | 50 | 10 | 8.7 | 63 | T |
| " | 50 | 20 | 18.4 | 69 | T |
| " | 50 | 30 | 15.1 | 69 | R |
| " | 50 | 40 | 12.3 | 68 | R |
| " | 60 | 10 | 15.1 | 63 | R |
| " | 60 | 20 | 10.2 | 69 | R |
| " | 60 | 30 | 9.9 | 70 | R |
| " | 60 | 35 | 9.9 | 64 | R |
| $Pb(Co_{\frac{1}{3}}Nb_{\frac{2}{3}})O_3$ | 10 | 30 | 12.4 | 63 | T |
| " | 10 | 40 | 16.1 | 62 | T |
| " | 10 | 40 | 34.8 | 68 | M.P.B. |
| " | 10 | 60 | 28.7 | 70 | R |
| " | 10 | 70 | 30.6 | 72 | R |
| " | 10 | 80 | 31.3 | 71 | R |
| " | 20 | 20 | 9.0 | 64 | T |
| " | 20 | 30 | 18.6 | 69 | T |
| " | 20 | 40 | 35.2 | 73 | T |
| " | 20 | 50 | 41.9 | 67 | M.P.B. |
| " | 20 | 60 | 35.7 | 75 | R |
| " | 20 | 70 | 38.4 | 71 | R |
| " | 20 | 75 | 40.1 | 69 | R |
| " | 30 | 15 | 14.8 | 67 | T |
| " | 30 | 20 | 17.5 | 69 | T |
| " | 30 | 30 | 26.2 | 71 | T |
| " | 30 | 40 | 50.9 | 70 | M.P.B. |
| " | 30 | 50 | 48.6 | 68 | R |
| " | 30 | 60 | 51.3 | 67 | R |
| " | 30 | 65 | 52.0 | 66 | R |
| " | 40 | 10 | 12.7 | 62 | T |
| " | 40 | 20 | 21.4 | 69 | T |
| " | 40 | 30 | 42.1 | 69 | T |
| " | 40 | 40 | 57.8 | 68 | M.P.B. |
| " | 40 | 50 | 50.5 | 68 | R |
| " | 40 | 55 | 48.2 | 69 | R |
| " | 50 | 10 | 23.9 | 70 | T |
| " | 50 | 20 | 35.6 | 73 | T |
| " | 50 | 30 | 41.3 | 71 | R |
| " | 50 | 40 | 43.0 | 70 | R |
| " | 60 | 10 | 25.2 | 73 | T |
| " | 60 | 20 | 37.5 | 74 | T |
| " | 60 | 30 | 39.8 | 72 | R |
| " | | 35 | 38.4 | 71 | R |

T: tetragonal system,
R: rhombohedral system,
M.P.B.: morphotropic phase boundary

TABLE 4

| | Examples of Composite Oxide | | Examples of Chemicals or Compounds |
|---|---|---|---|
| perovskite structure | $A^{2+}B^{4+}O_3$ | | A:Pb,Ba,Ca,Sr,Cd etc. B:Sn,Hf etc. |
| | $A^{1+}B^{5+}O_3$ | | A:Li,Na,K,Ag etc. B:Nb,Ta etc. |
| composite perovskite structure | $A^{2+}(B^{2+}{}_{\frac{1}{3}}B^{5+}{}_{\frac{2}{3}})O_3$ | | $Pb(Mg_{\frac{1}{3}}Nb_{\frac{2}{3}})O_3$, $Pb(Mg_{\frac{1}{3}}Ta_{\frac{2}{3}})O_3$ $Pb(Ni_{\frac{1}{3}}Nb_{\frac{2}{3}})O_3$, $Pb(Mn_{\frac{1}{3}}Ta_{\frac{2}{3}})O_3$ $Pb(Mn_{\frac{1}{3}}Sb_{\frac{2}{3}})O_3$, $Pb(Zn_{\frac{1}{3}}Nb_{\frac{2}{3}})O_3$ $Pb(Zn_{\frac{1}{3}}Ta_{\frac{2}{3}})O_3$, $Pb(Mn_{\frac{1}{3}}Nb_{\frac{2}{3}})O_3$ $Pb(Co_{\frac{1}{3}}Sb_{\frac{2}{3}})O_3$, $Pb(Zn_{\frac{1}{3}}Nb_{\frac{2}{3}})O_3$ $Pb(Co_{\frac{1}{3}}Nb_{\frac{2}{3}})O_3$, $Pb(Fe_{\frac{1}{3}}Sb_{\frac{2}{3}})O_3$ $Pb(Fe_{\frac{1}{3}}Nb_{\frac{2}{3}})O_3$, $Pb(Mn_{\frac{1}{3}}Bi_{\frac{2}{3}})O_3$ etc. |
| | $A^{2+}(B^{3+}{}_{\frac{1}{2}}B^{5+}{}_{\frac{1}{2}})O_3$ | | $Pb(Fe_{\frac{1}{2}}Nb_{\frac{1}{2}})O_3$, $Pb(Sc_{\frac{1}{2}}Ta_{\frac{1}{2}})O_3$ $Pb(Y_{\frac{1}{2}}Nb_{\frac{1}{2}})O_3$, $Pb(Mn_{\frac{1}{2}}Sb_{\frac{1}{2}})O_3$ $Pb(In_{\frac{1}{2}}Nb_{\frac{1}{2}})O_3$, $Pb(Sb_{\frac{1}{2}}Nb_{\frac{1}{2}})O_3$ $Pb(Mn_{\frac{1}{2}}Nb_{\frac{1}{2}})O_3$ etc. |
| | $A^{2+}(B^{2+}{}_{\frac{1}{2}}B^{6+}{}_{\frac{1}{2}})O_3$ | | $Pb(Cd_{\frac{1}{2}}W_{\frac{1}{2}})O_3$, $Pb(Mg_{\frac{1}{2}}W_{\frac{1}{2}})O_3$ $Pb(Co_{\frac{1}{2}}W_{\frac{1}{2}})O_3$, $Pb(Ni_{\frac{1}{2}}W_{\frac{1}{2}})O_3$ $Pb(Mn_{\frac{1}{2}}W_{\frac{1}{2}})O_2$, $Pb(Ca_{\frac{1}{2}}W_{\frac{1}{2}})O_3$ etc. |
| | $A^{2+}(B^{3+}{}_{\frac{2}{3}}B^{6+}{}_{\frac{1}{3}})O_3$ | | $Pb(Fe_{\frac{2}{3}}W_{\frac{1}{3}})O_3$, $Pb(Mn_{\frac{2}{3}}W_{\frac{1}{3}})O_3$ etc. |
| | $A^{3+}(B^{2+}{}_{\frac{1}{2}}B^{4+}{}_{\frac{1}{2}})O_3$ | | $La(Mg_{\frac{1}{2}}Ti_{\frac{1}{2}})O_3$, $Nd(Mg_{\frac{1}{2}}Ti_{\frac{1}{2}})O_3$ etc. |
| | $(A^{1+}{}_{\frac{1}{2}}A^{3+}{}_{\frac{1}{2}})B^{4+}O_3$ | | $(K_{\frac{1}{2}}La_{\frac{1}{2}})TiO_3$, $(Na_{\frac{1}{2}}Bi_{\frac{1}{2}})TiO_3$ etc. |
| composite perovskite structure | $A^{2+}(B^{1+}{}_{\frac{1}{4}}B^{5+}{}_{\frac{3}{4}})O_3$ | | $Pb(Li_{\frac{1}{4}}Nb_{\frac{3}{4}})O_3$, $Pb(Cu_{\frac{1}{4}}Nb_{\frac{3}{4}})O_3$ $Pb(Li_{\frac{1}{4}}Sb_{\frac{3}{4}})O_3$ etc. |
| pyrochroa structure | $A_2B_2O_7$ | | A:Ba,Ca,Sr,Cd,La,Nd,Pb etc. B:Ta,Nb,Ti etc. |
| Bismuth layer-like structure | $Bi_2A_{x-1}B_xO_{3x+3}$ | | A:Ba,Ca,Sr,Pb etc. B:Ta,Nb,Ti etc. |
| tungsten bronze structure | $A_xB_2O_6$ | | A:Pb,Ba,Sr etc. B:Nb,Ta etc. |

Examples of other composite perovskite include $(K_{\frac{1}{2}}Bi_{\frac{1}{2}})TiO_3$, $Pb(Zn_{\frac{1}{3}}Nb_{\frac{2}{3}})O_3$, $Sr(Cu_{\frac{1}{3}}W_{\frac{1}{3}})O_3$, $(Na_{\frac{1}{2}}Bi_{\frac{1}{2}})TiO_3$,
$Pb(Co_{\frac{1}{3}}Nb_{\frac{2}{3}})O_3$, $Ba(Cu_{\frac{1}{3}}Ta_{\frac{2}{3}})O_3$, $Pb(Co_{\frac{1}{2}}W_{\frac{1}{2}})O_3$, $Pb(Ni_{\frac{1}{3}}Nb_{\frac{2}{3}})O_3$,
$Sr(Cu_{\frac{1}{3}}Ta_{\frac{2}{3}})O_3$, $Pb(Cd_{\frac{1}{3}}Nb_{\frac{2}{3}})O_3$, $Ba(Cu_{\frac{1}{3}}Nb_{\frac{2}{3}})O_3$, $Pb(Sc_{\frac{1}{2}}Nb_{\frac{1}{2}})O_3$,
$Pb(Mg_{\frac{1}{3}}Ta_{\frac{2}{3}})O_3$, $Sr(Cu_{\frac{1}{3}}Nb_{\frac{2}{3}})O_3$, $Pb(Fe_{\frac{1}{2}}Nb_{\frac{1}{2}})O_3$, $Pb(Co_{\frac{1}{2}}Ta_{\frac{1}{2}})O_3$,
$BaBiO_{2.8}$, $Pb(In_{\frac{1}{2}}Nb_{\frac{1}{2}})O_3$, $Pb(Ni_{\frac{1}{2}}Ta_{\frac{1}{2}})O_3$, $BaBiO_3$,
$Pb(Sc_{\frac{1}{2}}Ta_{\frac{1}{2}})O_3$, $Pb(Fe_{\frac{2}{3}}W_{\frac{1}{3}})O_3$, $Ba(Bi_{\frac{1}{2}}Nb_{\frac{1}{2}})O_3$, $Pb(Fe_{\frac{1}{2}}Ta_{\frac{1}{2}})O_3$,
$Pb(Sc_{\frac{2}{3}}W_{\frac{1}{3}})O_3$, $Ba(Bi_{\frac{1}{2}}Ta_{\frac{1}{2}})O_3$, $Pb(Mg_{\frac{1}{2}}Nb_{\frac{1}{2}})O_3$, $Ba(Cu_{\frac{1}{2}}W_{\frac{1}{2}})O_3$,
$Ba(Bi_{\frac{1}{2}}V_{\frac{1}{2}})O_3$, $Ba(Bi_{\frac{2}{3}}W_{\frac{1}{3}})O_3$, $Ba(Bi_{\frac{2}{3}}Mo_{\frac{1}{3}})O_3$, $Pb(Bi_{\frac{2}{3}}Mo_{\frac{1}{3}})O_3$,
$Tl(Zr_{\frac{1}{2}}W_{\frac{1}{2}})O_3$, $Pb(Li_{\frac{1}{4}}Sc_{\frac{1}{4}}W_{\frac{1}{2}})O_3$, $CdHfO_3$, $Pb(Li_{\frac{1}{4}}Fe_{\frac{1}{4}}w_{\frac{1}{2}})O_3$,
$Cd(Fe_{\frac{1}{2}}Nb_{\frac{1}{2}})O_3$, $Pb(Li_{\frac{1}{4}}Co_{\frac{1}{4}}W_{\frac{1}{2}})O_3$, $Cd(Sc_{\frac{1}{2}}Nb_{\frac{1}{2}})O_3$, $Pb(Li_{\frac{1}{4}}In_{\frac{1}{4}}W_{\frac{1}{2}})O_3$,
$Cd(Cr_{\frac{1}{2}}Nb_{\frac{1}{2}})O_3$, $Pb(Li_{\frac{1}{4}}Y_{\frac{1}{4}}W_{\frac{1}{2}})O_3$, $Cd(Mg_{\frac{1}{3}}Nb_{\frac{2}{3}})O_3$, $Pb(Li_{\frac{1}{4}}Tb_{\frac{1}{4}}W_{\frac{1}{2}})O_3$,
$Pb(Li_{\frac{1}{4}}Yb_{\frac{1}{4}}W_{\frac{1}{2}})O_3$, $Pb(Mg_{\frac{1}{4}}Mn_{\frac{1}{4}}Nb_{\frac{1}{2}})O_3$, $Pb(Li_{\frac{1}{4}}Ho_{\frac{1}{4}}W_{\frac{1}{2}})O_3$,
$Pb(Li_{\frac{1}{4}}Cd_{\frac{1}{4}}W_{\frac{1}{2}})O_3$, $Pb(Sc_{5/9} Nb_{\frac{1}{3}}W_{1/9})O_3$, $Pb(Li_{\frac{1}{4}}Pr_{\frac{1}{4}}W_{\frac{1}{2}})O_3$,
$Pb(Sc_{\frac{1}{4}}Cr_{\frac{1}{4}}Nb_{\frac{1}{2}})O_3$, $Pb(Li_{\frac{1}{4}}La_{\frac{1}{4}}W_{\frac{1}{2}})O_3$, $Pb(Cd_{\frac{1}{4}}Mn_{\frac{1}{4}}Nb_{\frac{1}{2}})O_3$,
$Pb(Li_{\frac{1}{4}}Sm_{\frac{1}{4}}W_{\frac{1}{2}})O_3$, $Pb(Mg_{\frac{1}{4}}M_{\frac{1}{4}}W_{\frac{1}{2}})O_3$, $Pb(Na_{\frac{1}{4}}Y_{\frac{1}{4}}W_{\frac{1}{2}})O_3$,
$Pb(Cd_{\frac{1}{4}}Mn_{\frac{1}{4}}W_{\frac{1}{2}})O_3$, $Pb(Na_{\frac{1}{4}}Ho_{\frac{1}{4}}W_{\frac{1}{2}})O_3$, $Pb(Co_{\frac{1}{4}}Mn_{\frac{1}{4}}W_{\frac{1}{2}})O_3$,
$Pb(Li_{\frac{1}{4}}Zr_{1/6} W_{\frac{1}{2}})O_3$, $Pb(Ni_{\frac{1}{4}}Mn_{\frac{1}{4}}W_{\frac{1}{2}})O_3$, $Pb(Cd_{4/9} Nb_{2/9} W_{\frac{1}{2}})O_3$,
$Pb(Ni_{\frac{1}{4}}Mn_{\frac{1}{4}}Nb_{\frac{1}{2}})O_3$, $Pb(Co_{\frac{1}{4}}Mn_{\frac{1}{4}}Nb_{\frac{1}{2}})O_3$, $(K_{\frac{1}{2}}Bi_{\frac{1}{2}})TiO_3$,
$Pb(Lu_{\frac{1}{2}}Nb_{\frac{1}{2}})O_3$, $(Na_{\frac{1}{2}}Bi_{\frac{1}{2}})TiO_3$, $Pb(Yb_{\frac{1}{2}}Ta_{\frac{1}{2}})O_3$, $Pb(Mg_{\frac{1}{2}}W_{\frac{1}{2}})O_3$, -continued

| | | | |
|---|---|---|---|
| $Pb(Lu_{\frac{1}{2}}Ta_{\frac{1}{2}})O_3$, | $Pb(Cd_{\frac{1}{2}}W_{\frac{1}{2}})O_3$, | $Pb(Mg_{\frac{1}{2}}W_{\frac{1}{2}})O_3$, | $Pb(Mn_{\frac{1}{2}}W_{\frac{1}{2}})O_3$, |
| $Pb_2GaNbO_6$, | $Pb(Mn_{\frac{1}{2}}W_{\frac{1}{2}})O_3$, | $Pb_2BiNbO_6$, | $Pb(Co_{\frac{1}{2}}W_{\frac{1}{2}})O_3$, |
| $Pb_2Cd_{\frac{1}{2}}Mn_{\frac{1}{2}}NbO_6$ | $Pb(Mn_{\frac{1}{2}}Re_{\frac{1}{2}})O_3$, | $Pb_2Cd_{\frac{1}{2}}Ti_{\frac{1}{2}}TaO_6$, | $Pb(In_{\frac{1}{2}}Nb_{\frac{1}{2}})O_3$, |
| $Pb(Li_{\frac{1}{4}}Nb_{\frac{1}{4}}W_{\frac{1}{2}})O_3$, | $Pb(Yb_{\frac{1}{2}}Nb_{\frac{1}{2}})O_3$, | $Pb(Cd_{\frac{1}{2}}Mn_{\frac{1}{2}}W_{\frac{1}{2}})O_3$, | |
| $Pb(Ho_{\frac{1}{2}}Nb_{\frac{1}{2}})O_3$, | $CdSc_{\frac{1}{2}}Nb_{\frac{1}{2}}O_3$ | | | and the like.

Examples of composite pyrochroa include

| | | | |
|---|---|---|---|
| $Cd_2Nb_2O_7$, | $Pb_{1.9}Ba_{0.1}Li_{0.5}Nb_{1.5}O_6$, | $Cd_2Nb_2O_6S$, | $Pb_2BiNbO_6$, |
| $Cd_2CrNbO_6$, | $Pb_2BiTaO_6$, $Cd_2FeNbO_6$, | $Pb_2Bi_{\frac{1}{2}}W_{\frac{1}{2}}O_6$, | $Ba_2Zn_{\frac{1}{2}}Ta_{\frac{1}{2}}O_6$, |
| $Pb_2Bi_{\frac{1}{2}}Mo_{\frac{1}{2}}O_6$ | | | | and the like.

Examples of Bismuth layer-like compound include

| | | |
|---|---|---|
| $Bi_4Ti_3O_{12}$, | $Bi_2WO_6$, $PrBi_4Ti_3FeO_{15}$, | $PrBi_3Ti_3O_{12}$, |
| $Bi_2NbO_5F$, | $Ba_2Bi_4Ti_5O_{18}$, $HoBi_3Ti_3O_{12}$, | $Bi_2TaO_5F$, |
| $Pb_2Bi_4Ti_5O_{18}$, | $LaBi_3Ti_3O_{12}$, $Bi_3TiNbO_9$, | $Sr_2Bi_4Ti_5O_{18}$, |
| $CaBi_4Ti_4O_{15}$, | $Bi_3TiTaO_9$, $Bi_5Ti_3FeO_{15}$, | $BaBi_4Ti_4O_{15}$, |
| $SrBi_2Nb_2O_9$, | $Bi_6Ti_3FeO_{18}$, $PbBi_4Ti_4O_{15}$, | $SrBi_2Ta_2O_9$, |
| $Bi_5Bi_4Ti_3Fe_5O_{27}$, | $SrBi_4Ti_4O_{15}$, $BaBi_2Nb_2O_9$, | $CaBi_5Ti_4FeO_{18}$, |
| $LaBi_4Ti_3FeO_{15}$, | $BaBi_2Ta_2O_9$, $SrBi_5Ti_4FeO_{18}$, | |
| $PbBi_2Nb_2O_9$, | $Pbi_2Ta_2O_9$ | | and the like.

Examples of composite tungusten bronze include

| | | | |
|---|---|---|---|
| $KSr_2Nb_5O_{15}$, | $Ba_2Na_3LaNb_{10}O_{30}$, | $KSr_{4.5}Nb_{10}O_{38}$, | $Ba_3NaLaNb_{10}O_{30}$, |
| $K_2Sr_2Nb_5O_{14}F$, | $Ba_2Na_3EuNb_{10}O_3$, | $NaSr_2Nb_5O_{15}$, | $Ba_2Na_3GdNb_{10}O_{30}$, |
| $LiKSr_4Nb_{10}O_{30}$, | $Ba_3NaGdNb_{10}O_{30}$, | $LiNaSr_4Nb_{10}O_{30}$, | $Ba_2Na_3DyNb_{10}O_{30}$, |
| $KBa_2Nb_5O_{15}$, | $Ba_2Na_3YNb_{10}O_{30}$, | $NaBa_2Nb_5O_{15}$, | $Ba_3NaYNb_{10}O_{30}$, |
| $LiBa_2Nb_2O_{15}$, | $Ba_6Ti_2Nb_8O_{30}$, | $KPb_2Nb_5O_{15}$, | $BaZr_{0.25}Nb_{1.5}O_{5.25}$, |
| $Ba_9MgNb_{14}O_{45}$, | $Ba_6FeNb_9O_{30}$, | $Sr_9MgNb_{14}O_{45}$, | $Sr_6Ti_2Nb_8O_{30}$, |
| $Ba_{1.3}Sr_{3.7}Nb_{10}O_{30}$, | $Ba_2Sr_3Nb_{10}O_{30}$, | $Ba_{2.7}Sr_{2.3}Nb_{10}O_{30}$, | |
| $K_3Li_2Nb_5O_{15}$, | $K_3Li_2Ta_5O_{15}$ | | | and the like.

Examples Using Piezoelectric Material of the Lead Titanate System

Table 5 shows composition and effective Poisson's ratio of piezoelectric materials used for obtaining piezoelectric vibrators, together with the piezoelectric characteristic thereof.

Sample No. 1 is the PZT system piezoelectric material to obtain a comparative example, and the same has a composition near M.P.B. of the PZT system to enable the energy of the thickness extensional fundamental vibration to be trapped. In Sample No. 2, the piezoelectric material of the same composition as Sample No. 6 is used to structure the conventional piezoelectric resonance device of the single plate type utilizing the energy-trapping of the third harmonic wave.

The examples using these Sample Nos. 1 and 2 are outside the scope of the present invention. It will be understood that the resonance device obtained by the use of Sample No. 1 has a drawback that the heat-resistance of PZT of Sample No. 1 is not sufficient. Further, with the device obtained by using Sample No. 2, both the electromechanical coupling factor $k_t$ and the impedance difference are small.

On the contrary, it will be understood that any of the present inventive resonance devices obtained by the use of the lead titanate system and of the energy-trapped type of the second harmonic have the large impedance difference and show the superior heat-resistance property.

Figure 11:
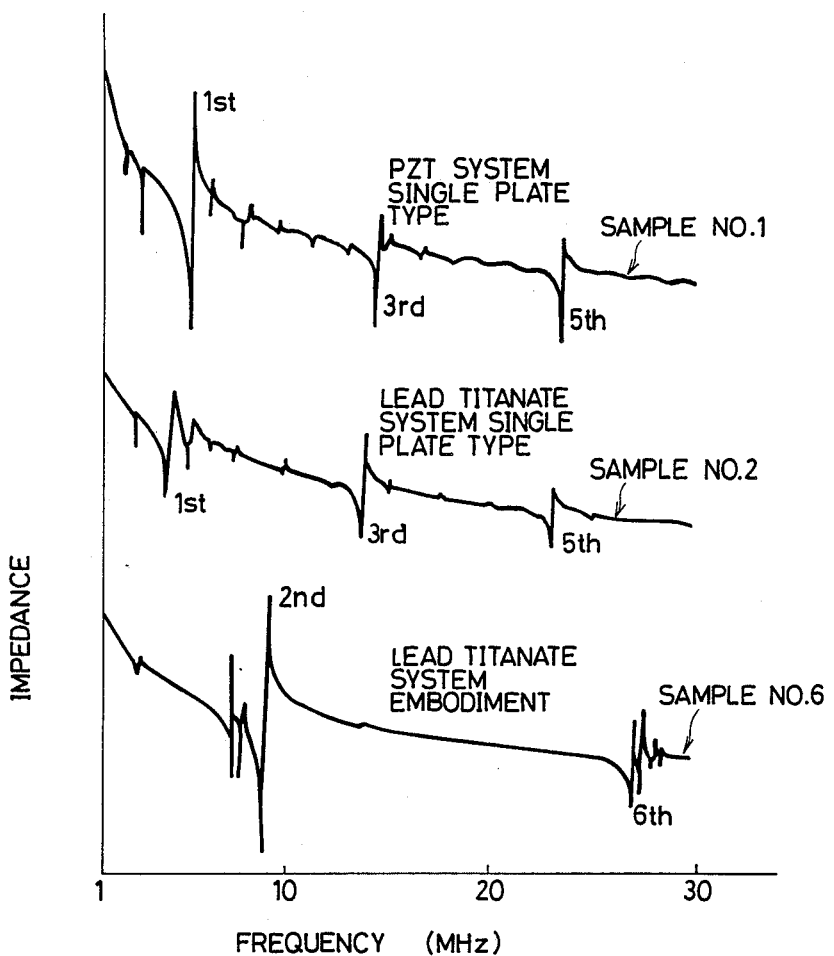
FIG. 11 is a diagram showing the impedance-frequency characteristic of the embodiment and comparative example using the piezoelectric material of the lead titanate system.

FIG. 11 shows the impedance-frequency characteristic of the resonance devices described above obtained by the use of Sample Nos. 1, 2 and 6, respectively. As shown in FIG. 11, it is understood that with the device made of Sample No. 6 according to the present invention, the spurious is suppressed and the secondary harmonic is strongly exited, thereby bringing out the good performance.

In addition, the piezoelectric material of the lead titanate used in the present invention contains at least Pb and Ti therein and includes $PbTiO_3$ as the major component. Further, such material encompasses the material added with the elements as shown in Table 6 described below; the material with a part of Pb or Ti being substituted with such elements in Table 6; the material including $PbTiO_3$ as one component and obtained by the solid of one or more kind of the composite oxides shown in Table 7 thereto; or the material obtained by the use of all of the addition, substitution and solid-solution described above.

There may be also used the composition being off stoichiometric composition within the range of ±50%. The feature of all the materials described above is that they are ferroelectrics.

TABLE 5

| Sample No. | mode | composition | effective Poisson's ratio | $K_t$ % | impedance difference | Limiting temperature for heat-resisting |
|---|---|---|---|---|---|---|
| *1 | F | $PbTi_{0.45}Zr_{0.45}$ $(Mn_{\frac{1}{2}}Nb_{\frac{1}{2}})_{0.10}O_3$ | 0.40 | 40 | 58 | 220 |
| *2 | 3rd | $Pb_{0.85}La_{0.10}TiO_3$ +0.5% $MnO_2$ | 0.25 | 9 | 50 | 330 |
| 3 | 2nd | $Pb_{0.94}La_{0.04}TiO_3$ +0.5% $MnO_2$ | 0.21 | 24 | 65 | 440 |

TABLE 5-continued

| Sample No. | mode | composition | effective Poisson's ratio | $K_t$ % | impedance difference | Limiting temperature for heat-resisting |
|---|---|---|---|---|---|---|
| 4 | 2nd | $Pb_{0.95}La_{0.06}TiO_3$ +0.5% $MnO_2$ | 0.21 | 32 | 75 | 400 |
| 5 | 2nd | $Pb_{0.88}La_{0.08}TiO_3$ +0.5% $MnO_2$ | 0.22 | 33 | 74 | 340 |
| 6 | 2nd | $Pb_{0.87}La_{0.10}TiO_3$ +0.5% $MnO_2$ | 0.22 | 30 | 74 | 300 |
| 7 | 2nd | $Pb_{0.80}La_{0.12}TiO_3$ +0.5% $MnO_2$ | 0.23 | 35 | *77 | 280 |
| 8 | 2nd | $Pb_{0.85}La_{0.07}Nd_{0.03}TiO_3$ +0.1% CuO +0.4% $MnO_2$ | 0.23 | 30 | 72 | 350 |
| 9 | 2nd | $Pb_{0.92}Ca_{0.08}TiO_3$ +0.5% $MnO_2$ +0.1% $Cr_2O_3$ | 0.21 | 35 | 68 | 320 |
| 10 | 2nd | $Pb_{0.88}Ce_{0.08}TiO_3$ +0.6% $MnO_2$ | 0.22 | 32 | 78 | 330 |
| 11 | 2nd | $Pb_{0.90}Nd_{0.07}TiO_3$ +0.5% $MnO_2$ +0.2% CuO | 0.25 | 37 | 72 | 320 |
| 12 | 2nd | $Pb_{0.86}Sn_{0.09}TiO_3$ +0.5% $MnO_2$ | 0.21 | 34 | 75 | 310 |

In Table 5, the expressions "F", "2nd" and "3rd" mean the fundamental, secondary and third harmonics respectively. Indication * denotes outside the scope of the present invention. "%" in composition is % by weight.

TABLE 6

| elements for addition or substitution |
|---|
| Ba, Sr, Ca, La, Ce, Pr, Nd, Pm, Sm, Eu, In, Sb, Ta, Nb Bi, Sn, W, Mn, Fe, Co, Ni, Cu, Zn, Mg, Cr, Ge |

TABLE 7

| compound making solid solution | | |
|---|---|---|
| $Pb(Co_{\frac{1}{2}}W_{\frac{1}{2}})O_3$, | $Pb(Mn_{\frac{1}{3}}Nb_{\frac{2}{3}})O_3$, | $(Na_{\frac{1}{2}}Bi_{\frac{1}{2}})TiO_3$, |
| $(K_{\frac{1}{2}}Bi_{\frac{1}{2}})TiO_3$, | $Pb(In_{\frac{1}{2}}Nb_{\frac{1}{2}})O_3$, | $Pb(Sc_{\frac{1}{2}}Nb_{\frac{1}{2}})O_3$, |
| $Ba(Zn_{\frac{1}{3}}Nb_{\frac{2}{3}})O_3$, | $Pb(Zn_{\frac{1}{3}}Nb_{\frac{2}{3}})O_3$, | $Pb(Zn_{\frac{1}{3}}Nb_{\frac{2}{3}})O_3$, |
| $Pb(Mg_{\frac{1}{2}}Nb_{\frac{1}{2}})O_3$, | $Pb(Fe_{\frac{1}{2}}W_{\frac{1}{2}})O_3$, | $Pb(Ni_{\frac{1}{3}}Nb_{\frac{2}{3}})O_3$, |
| $Pb(Co_{\frac{1}{2}}Nb_{\frac{2}{3}})O_3$, | $Pb(Sn_{\frac{1}{2}}Sb_{\frac{1}{2}})O_3$, | $Pb(Sn_{\frac{1}{2}}Sb_{\frac{1}{2}})O_3$, |

What is claimed is:

1. A piezoelectric resonance device of the energy-trapping-by-frequency-lowering type using a harmonic wave above the fundamental wave of the thickness extensional vibration mode, said device comprising:
    a plate-like body comprising a plurality of layers of a lead titanate-zirconate system piezoelectric material, said plurality of layers being stacked to form said plate-like body and thereby defining a direction of thickness;
    at least three electrodes so disposed that the electrodes are overlapped with each other on opposite sides of respective piezoelectric layers in said direction of thickness;
    each of said electrodes having a vibrating electrode portion and a conducting portion for connecting the vibrating electrode portion to a side edge of said plate-like body;
    wherein all of said conducting portions are so formed that no given conducting portion is overlapped with any adjacent conducting portion, or any portions of other electrodes, in the direction of the thickness; and
    wherein said piezoelectric material has such an effective Poisson's ratio that the piezoelectric material is not usable to trap the fundamental mode energy of the thickness extensional vibration mode by lowering the resonance frequency.

2. A piezoelectric resonance device as set forth in claim 1, wherein the piezoelectric layers interposed between said electrodes are polarized in the direction of thickness with the directions of polarization of adjacent piezoelectric layers being opposite to one another.

3. A piezoelectric resonance device as set forth in claim 1, wherein all the piezoelectric layers interposed between said electrodes are polarized in the same direction in the direction of the thickness.

4. A piezoelectric resonance device as set forth in claim 1, wherein the number of said electrodes is an odd number of three or more and the harmonic wave used is an even order mode.

5. A piezoelectric resonance device of the energy-trapping-by-frequency-lowering type using a harmonic wave above the fundamental wave of the thickness extensional vibration mode, said device comprising;
    a plate-like body comprising a plurality of layers of a lead titanate system piezoelectric material, said plurality of layers being stacked to form said plate-like body and thereby defining a direction of thickness;
    at least three electrodes so disposed that the electrodes are overlapped with each other on opposite sides of respective piezoelectric layers in said direction of thickness;
    each of said electrodes having a vibrating electrode portion and a conducting portion for connecting the vibrating electrode portion to a side edge of said plate-like body;
    wherein all of said conducting portions are so formed that no given conducting portion is overlapped with any adjacent conducting portion, or any portions of other electrodes, in the direction of the thickness; and
    wherein said piezoelectric material has such an effective Poisson's ratio such that the piezoelectric material is not usable to trap the fundamental mode energy of the thickness extensional vibration mode by lowering the resonance frequency.

6. A piezoelectric resonance device set forth in claim 1, wherein said piezoelectric material falls in a tetragonal or rhombohedral crystal system.

7. A piezoelectric resonance device as set forth in claim 5, wherein said piezoelectric material falls in a tetragonal or rhombohedral crystal system.

8. A piezoelectric resonance device as set forth in claim 5, wherein the number of said electrodes is an odd number of three of more and the harmonic wave used is an even order mode.

9. A piezoelectric resonance device of the energy-trapped type using a harmonic wave above the fundamental wave of the thickness extensional vibration mode, said device comprising:

a plate-like body comprising a plurality of layers of a piezoelectric material, said plurality of layers being stacked to form said plate-like body and thereby defining a direction of thickness;

at least three electrodes so disposed that the electrodes are overlapped with each other on opposite sides of respective piezoelectric layers in said direction of thickness;

each of said electrodes having a vibrating electrode portion and a conducting portion for connecting the vibrating electrode portion to a side edge of said plate-like body;

wherein all of said conducting portions are so formed that no given conducting portion is overlapped with any adjacent conducting portion, or any portions of other electrodes, in the direction of the thickness; and wherein said piezoelectric material has an effective Poisson's ratio of less than $\frac{1}{3}$.

10. A piezoelectric resonance device as set forth in claim 9, wherein said piezoelectric material is composed of lead titanate-zirconate system material.

11. A piezoelectric resonance device as set forth in claim 9, wherein said piezoelectric material is composed of lead titanate system material.

* * * * *